United States Patent [19]

Fisher et al.

[11] B 3,983,492
[45] Sept. 28, 1976

[54] FREQUENCY SCAN AND LOCK CIRCUIT FOR MOBILE RADIO CHANNEL SELECTION

[75] Inventors: Reed Edward Fisher, Parsippany-Troy Hills Township, Morris County, N.J.; Robert William Humes, Martinsville, Ind.

[73] Assignee: Bell Telephone Laboratories, Incorporated, Murray Hill, N.J.

[22] Filed: Jan. 29, 1975

[21] Appl. No.: 544,961

[44] Published under the second Trial Voluntary Protest Program on January 13, 1976 as document No. B 544,961.

[52] U.S. Cl................................. 325/468; 325/56; 325/63
[51] Int. Cl.² ........................................ H04B 1/32
[58] Field of Search ............... 325/56, 63, 302, 304, 325/306, 307, 332, 469, 468, 470, 335; 328/154, 104; 343/205, 206

[56] References Cited
UNITED STATES PATENTS

| 3,443,228 | 5/1969 | Brenner et al. | 325/56 |
| 3,532,988 | 10/1970 | Magnuski | 325/63 |

Primary Examiner—Benedict V. Safourek
Attorney, Agent, or Firm—C. S. Phelan

[57] ABSTRACT

Sequentially received frequency channel samples in a mobile radio telecommunication system are compared by pairs. The name of the channel providing the larger sample in any comparison is overwritten into a storage register if that larger sample is also the newest sequential sample of the pair. The next sample of the sequence is compared to only the larger sample determined in the previous comparison operation. At the end of the sampling sequence the channel name remaining in the register is utilized to tune the mobile unit receiver to the named channel.

5 Claims, 3 Drawing Figures

FREQUENCY SCAN AND LOCK CIRCUIT FOR MOBILE RADIO CHANNEL SELECTION

BACKGROUND OF THE INVENTION

1. Field of the Invention

This invention relates to mobile radio telecommunication transceivers and it relates in particular to a circuit for tuning a transceiver to the strongest of plural receivable frequency channel signals.

2. Prior Art

One prior type of mobile radio telecommunication transceiver is indicated in an A. E. Joel U.S. Pat. No. 3,663,762 which deals with a high capacity telecommunication system. That system is designed to increase the utilization of the available frequency spectrum by employing plural base stations each serving a different part, or cell, of a common geographical region. The base stations are served by a common land line switching office. Within at least one group of base stations, each base station has a different frequency channel for limited supervisory communication with mobile units in its cell. That channel is sometimes also called a data channel, setup channel, or an access channel. The latter term will usually be employed here. Each base station also has a different set of message communication channels that can be employed by mobile units in its cell. In order to facilitate efficient utilization of message communication channels available in the region at any given time, it is desirable that each mobile unit utilize the access channel of the cell in which the unit is then located. To this end the Joel patent has indicated that the mobile unit should have circuits for examining the various receivable access channels and seizing the one of those channels that is the strongest. The presumption underlying this technique is that the base station corresponding to that strongest access channel will be the base station of the cell in which the mobile unit is located. Having once tuned to the strongest access channel, the mobile unit can then be directed by the base station to tune to any available one of the message channels in the cell for establishing and conducting communication between human subscribers.

The foregoing technique for scanning channels and seizing the strongest channel is to be distinguished from prior systems wherein a mobile unit may have plural receivable message channels and it is arranged to scan those channels until it finds one having satisfactory received signal characteristics vis-a-vis the one having the strongest received signals in the entire group of receivable channels.

Present circuits for scanning channels and seizing the strongest thereof employ digital arrangements which, although convenient to manufacture, require substantial hardware. Some such circuits also require relatively critical component design, and all of these circuits require substantial space in a unit that should be as small as possible in order to facilitate portability and to facilitate mounting in a confined vehicle space.

SUMMARY OF THE INVENTION

An illustrative embodiment of the present invention overcomes the indicated difficulties of the prior art arrangements by providing a control unit in a tunable receiver for causing the receiver to be tuned through a predetermined sequence of frequency channels. Received channel samples are steered to one or the other of two analog sample and hold circuits. Outputs of the latter circuits are compared; the sequential name of the larger sample is stored by the control means; and the sample and hold circuit of the smaller sample is enabled to receive the next new sample of the scanning sequence. At the end of the sequence only the name of the strongest received channel sample is left in storage, and it is used to tune the receiver to the named channel for further supervisory signaling in connection with the establishment of a mobile call connection.

BRIEF DESCRIPTION OF THE DRAWING

A more complete understanding of the present invention and its various features, objects, and advantages may be obtained from a consideration of the following detailed description in connection with the appended claims and the attached drawing in which:

DETAILED DESCRIPTION

Figure 1:
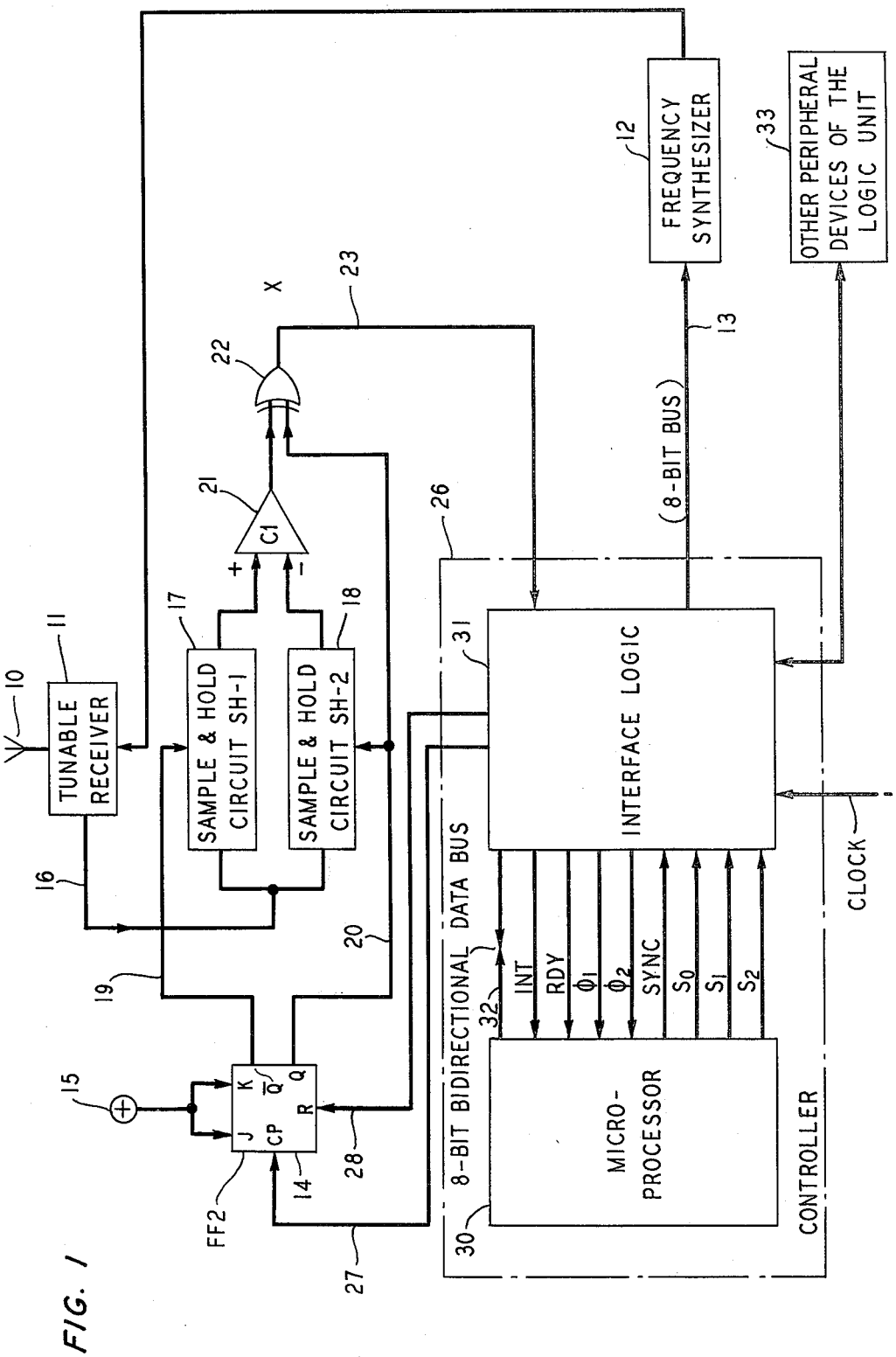
FIG. 1 is a simplified block and line diagram of a scan and lock circuit of the present invention.

FIG. 1 contains in simplified block diagram form a diagram of the relevant parts of a mobile radio set for a high capacity mobile telecommunication system, such as that system depicted in the aforementioned Joel patent. Signals received by an antenna 10 activate a tunable receiver 11 which is tuned, along with a transmitter (not shown), by a frequency synthesizer 12 to operate in the receiving portion of a communication channel of the telecommunication system. The present invention is concerned primarily with the selection of an appropriate one of plural access communication channels over which the mobile unit can communicate with respective ones of plural base stations in the telecommunication system. The apparatus of the invention is concerned with circuitry which causes the frequency synthesizer 12 to scan the available access communication channels to enable a determination of relative signal strength in each of those channels. This determination is sought as a practical assurance that the mobile unit will be placed into communication with the base station which is assigned to the particular geographical cell of the overall telecommunication system in which the mobile unit is then located.

The synthesizer 12 is arranged so that a multibit digital character supplied on a bus 13 can be used by the synthesizer to tune the mobile set to a frequency channel named by that digital character. Various circuit techniques are known in the art for accomplishing this type of digital word control of radio communication equipment. For example, a digitally controlled frequency synthesizer is shown in the copending C. W. Schaible application Ser. No. 512,537, filed Oct. 7, 1974, entitled "Phase-Locked Frequency Synthesizer With Means for Restoring Stability," and assigned to the same assignee as the present application. Some earlier frequency synthesizer techniques are discussed in a paper by A. F. Evers, "A Versatile Digital Frequency Synthesizer for Use in Mobile Radio Communication Sets," *Electronic Engineering*, Vol. 38, pages 296–303, May 1966.

An analog output from the receiver 11 is applied in multiple by way of a lead 16 to input connections of two sample and hold circuits 17 and 18, otherwise designated SH-1 and SH-2, respectively. The signal on lead 16 is advantageously derived from a receiver automatic gain control circuit so that it is a direct current voltage approximately proportional to the received radio signal strength in receiver 11.

Each of the sample and hold circuits 17 and 18 has the same design and may be of any suitable type. For example, each sample and hold circuit is advantageously an insulated gate field effect transistor enabled by a control pulse to allow the lead 16 signal to charge a capacitor for a fixed time. A high input impedance direct current amplifier couples the capacitor voltage to an output lead of the sample and hold circuit. Control pulses are supplied on leads 19 and 20 from complement and true outputs, respectively, of a bistable trigger circuit such as the flip-flop circuit 14. That circuit has its J and K inputs biased from a source 15 of positive potential so that circuit 14 toggles in response to each control pulse received at its clock input. The receiver circuit supplying the signal on lead 16 is advantageously a circuit with low output impedance so that sample and hold circuit capacitors are either charged or discharged as necessary to adapt the charge to the new signal level on lead 16.

An operational amplifier, voltage comparator circuit 21, otherwise also designated C1, has its noninverting input connection coupled to receive the output of the sample and hold circuit 17. Similarly, the inverting output of the comparator 21 is coupled to receive the output signal of the sample and hold circuit 18. Any comparator having a high input impedance can be employed. For example, a $\mu$A734 comparator of the Fairchild Semiconductor Company has been advantageously employed in one embodiment. This comparator is found at pages 4–13 to 4–19 in "Fairchild Semiconductor — The Linear Integrated Circuits Data Catalogue," February 1973. The output signal of comparator 21 is conveniently at a high voltage level, e.g., about 5 volts, for a comparison in which the input from the sample and hold circuit 17 is the larger of the two comparator inputs. Similarly, the comparator output is at a relatively low voltage level, e.g., about 0.4 volt, if the input from sample and hold circuit 18 is the larger of the two inputs.

An EXCLUSIVE OR logic gate 22 of any convenient design performs an EXCLUSIVE OR logic operation with respect to the output of comparator 21 and the control signal input on circuit 20 for enabling the sample and hold circuit 18. Thus, gate 22 produces a high level output X on a lead 23 when the sample and hold circuit which last received an analog signal sample in the paging channel scanning sequence, also holds the larger of the two samples in circuits 17 and 18. A low level output from EXCLUSIVE OR gate 22 indicates that the sample and hold circuit that last received a sample in the scanning sequence holds the smaller of the two samples.

The signal on lead 23 is applied to an input of a controller 26 which controls the entire mobile set logic unit, of which illustrated circuits of the present invention are only a part. That logic unit determines the manner in which the mobile set effects its part in the supervisory communication function with a base station for initiating, maintaining, and terminating call connections with other subscribers, both within a single cell of the telecommunication system and as the mobile set moves from cell to cell. However, only those aspects of the controller 26 which are useful in illustrating the arrangement and operation of the present invention are hereinafter considered. The controller 26 also provides signals on leads 27 and 28 for controlling, in a manner to be described, the flip-flop circuit 14 to provide enabling signals to one or the other of the sample and hold circuits 17 and 18.

Controller 26 is arranged to operate the frequency synthesizer 12 and the sample and hold circuits 17 and 18 for determining which of the various access channels of the telecommunication system has the strongest received signal at the mobile set under consideration. For this purpose, controller 26 advantageously includes a microprocessor 30 and interface logic 31. A suitable microprocessor is the one commercially known as the Intel 8008 microprocessor manufactured by Intel Corporation of Santa Clara, Calif. This microprocessor and the manner of operation thereof are described in a manual published by Intel Corporation for the processor and entitled *MCS 8 Microcomputer Set — 8008 8-Bit Parallel Central Processor Unit User's Manual*, published in November 1973, Revision 4, Second Printing. Apart from various timing input and output connections, the microprocessor 30 has, among other parts, an 8-bit parallel data input/output bus 32, temporary registers, and an arithmetic unit. The processor is operated by stored program in a memory not separately shown.

Interface logic 31 is provided for signal distribution and collection for the microprocessor in synchronism with the various operating cycles of program execution in the microprocessor. Thus, the interface logic 31 receives multibit words from the microprocessor on the bus 32. A word may include data, operation code, and address information fields, or it may include only data. The word is buffered by circuits, not separately shown, in the interface logic which respond to the operation code for steering the data through demultiplexing type circuits to the peripheral circuitry specified in the address. Such circuitry is, for example, the flip-flop circuit 14, frequency synthesizer 12, and other peripheral devices schematically represented by the block 33 in FIG. 1. Insofar as signal collection is concerned, the interface logic 31 responds to a peripheral device address and a "read" operation code received on the data bus 32 from the microprocessor for reading the output of the addressed peripheral device and multiplexing that output onto the data bus 32 along with address information indicating the device from which it was received. Such an addressed device can, for example, be the output lead 23 of EXCLUSIVE OR gate 22, or some of the other peripheral devices indicated by the block 33.

Details of the interface logic are not shown because they comprise no part of the present invention and can be configured in many ways known to those skilled in the art for achieving the aforementioned signal distribution and collection functions. It is noted simply that the interface logic 31 receives a clock signal from a source (not shown) in the mobile unit, and produces from the clock signal additional signals which are provided to the microprocessor for enabling its operation. One form of compatible interface logic for performing the indicated functions necessary to the present invention is shown on pages 26 and 27 of the aforementioned manual for the microprocessor. Timing and control leads between microprocessor 30 and logic 31 are those shown in the manual for the interfacing function.

Figure 2:
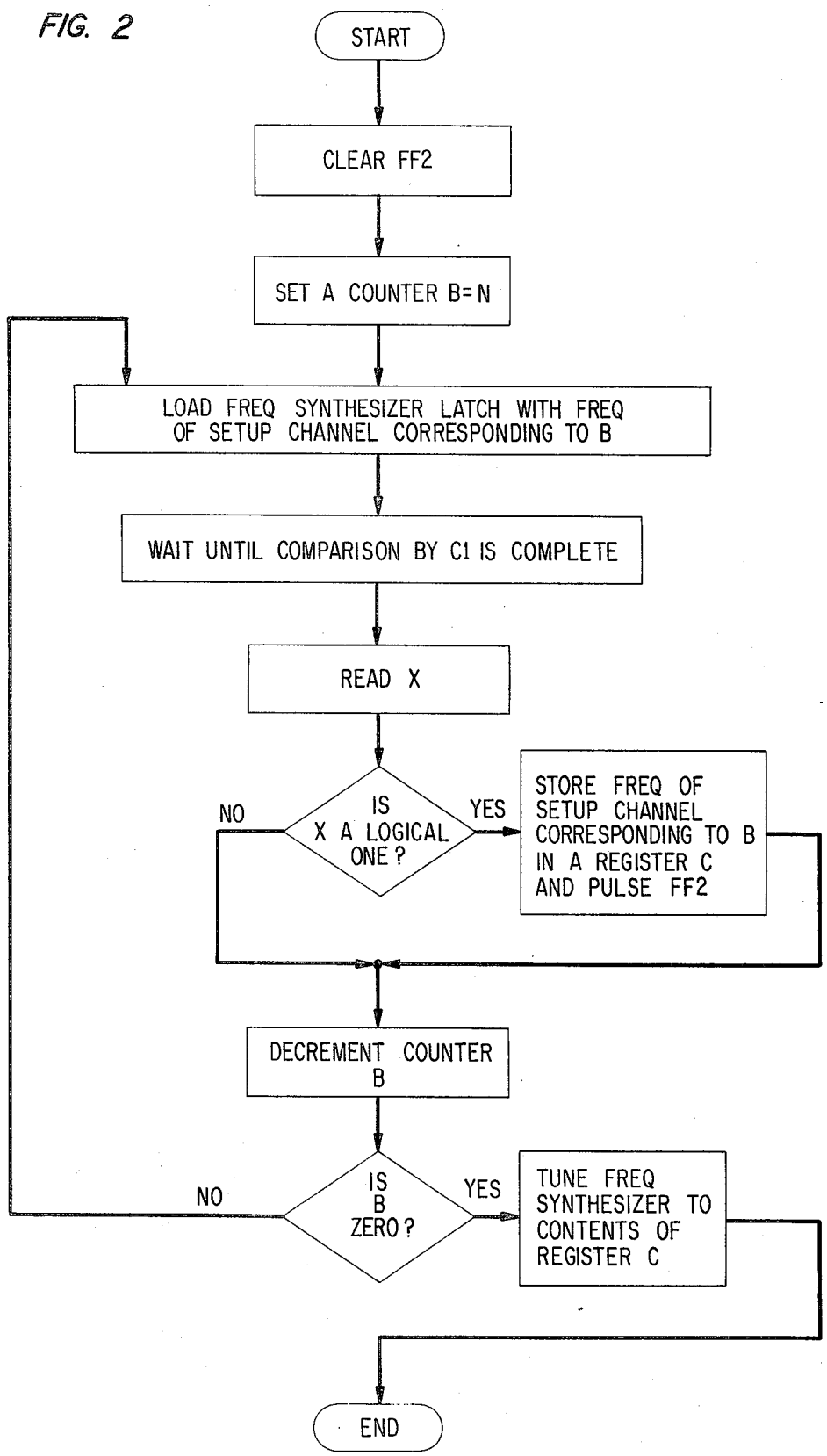
FIG. 2 is a flow diagram of the operation of a controller in the diagram of FIG. 1.

A more specific picture of the operation of the scan and lock logic of FIG. 1 can be obtained from a consideration of the controller 26 flow diagram in FIG. 2. That diagram also incorporates the time sequential operating information which defines, in a functional sequence manner, the design of the interface logic 31. The assembly level coding for the aforementioned Intel microprocesssor to carry out the process of FIG. 2 for controlling the frequency synthesizer 12 and the sample and hold circuits 17 and 18 is contained in the attached Appendix. The process contemplates use of temporary storage registers B, C, and L in the microprocessor.

Referring to FIG. 2, the scan and lock routine is initiated either periodically by program in an idle mobile unit or on command by a base station sending on its access channel a supervisory signal addressed to the illustrated mobile set. Either of those functions initiates in the mobile set logic unit, e.g., in peripheral devices block 33, functions which cause the microprocessor 30 to call the scan and lock routine illustrated in FIG. 2. Circuits for initiating such a routine call are not specifically shown because they comprise no part of the present invention. Initially the microprocessor 30 outputs a signal through data bus 32 and interface logic 31 for pulsing the lead 28 to reset flip-flop circuit 14, thereby placing a high level signal on the control lead 19 for enabling sample and hold circuit 17. The microprocessor also sets an internal counter B in the microprocessor, i.e., a processor temporary register which is operated in a decremented mode by processor software. The counter B is set to an initial count level N where N is equal to the number of base station access channels which are receivable by the mobile set. Content of counter B is hereinafter called the setup channel. If the shortest anticipated interval between scan and lock routines is not long enough for most of the charge to leak off the sample and hold circuit capacitors, clearing circuits (not shown) can be provided.

Next, processor 30 loads frequency synthesizer 12, by the signal distribution technique previously described, with a multibit digital word defining the first channel in the scan and lock scanning sequence. This word corresponds to the contents of the counter B. Processor 30 is now placed in a waiting mode while the receiver 11 is tuned to the channel defined by the newly loaded frequency synthesizer 12. The waiting mode includes additional delay for an interval which would be appropriate for a received signal sample in that channel to be entered into the sample and hold circuit 17, and for a stabilization of the resulting operation of comparator 21 and EXCLUSIVE OR gate 22.

At the end of the waiting interval, the comparison should be complete and processor 30 calls for a reading of the X signal on lead 23. That signal is supplied to the microprocessor 30; and, in a typical testing operation, it is evaluated to determined whether or not the signal level represents a binary ONE. If the test produces a "yes" result indicating that a binary ONE is present, the frequency of the setup channel, as designated in the counter B, is stored in a processor internal temporary register C. In addition, the processor 30 causes a signal to be applied to the lead 27 to clock flip-flop circuits 29 and force it to change state. Next the processor 30 causes the counter B to be decremented for specifying the next channel sample to be evaluated. Alternatively, if the test of the X signal had indicated a "no" condition, i.e., the absence of a binary ONE on lead 23, it is known that the new sample is not larger than a previously stored sample in the same sequence so the processor jumps directly to the step of decrementing the counter B as just noted.

Now the contents of the processor counter B are tested to determine whether or not they are at the zero count level. If the result is "no," there are more channels to be evaluated; and the processor loops back to the step for loading the frequency synthesizer 12 with the contents of the processor counter B, and all of the aforementioned steps of comparison, testing, and decrementing are repeated. However, if the content of the counter B is found to equal zero, the test produces a "yes" result; and now the frequency synthesizer 12 is loaded with the contents of the register C. The nature of the foregoing comparison and storage process is such that the register C at this time contains only the name of the access channel which had the largest received signal of all the access channels receivable by the mobile set. The frequency synthesizer correspondingly retunes the receiver 11 to the indicated paging channel so that the base station can further direct the mobile set to be further retuned to a particular available message channel on which a call connection can be established. It will be clear from the foregoing description that all operations performed by the controller 26 are individually well known for data processing machines and can be readily programmed to be performed by any such machine which is capable of the input/output, counting, reading, testing, and storing functions employed to control sequentially the sample and hold circuits 17 and 18 and the frequency synthesizer 12.

Figure 3:
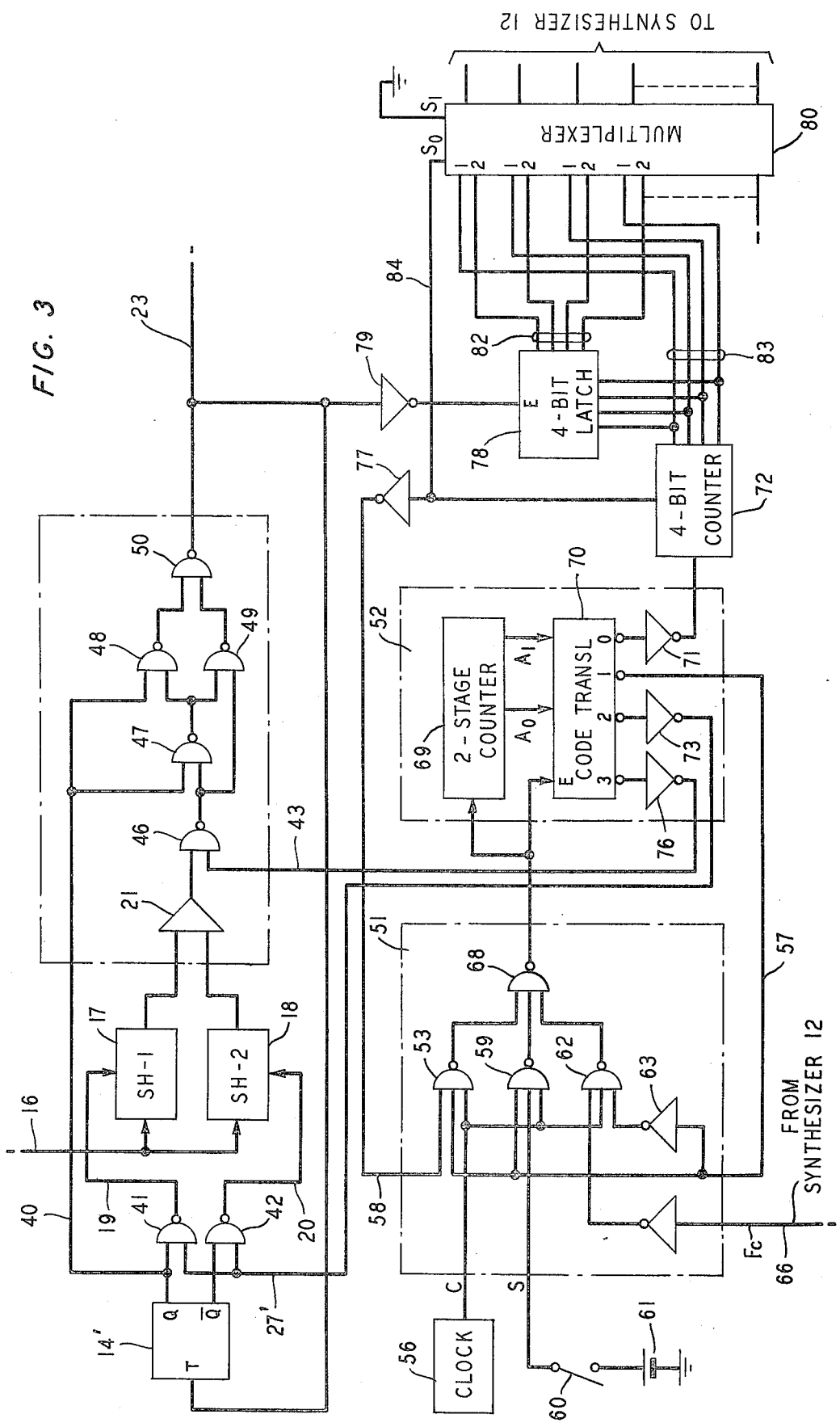
FIG. 3 is a logic diagram of a modified circuit of the present invention.

FIG. 3 is a logic diagram of a modified embodiment of the invention which is controllable in a somewhat different fashion from that described for the embodiment of FIG. 1. The FIG. 3 embodiment is controllable by a clock signal input and by manually operable switches which can be set by a mobile unit subscriber. Alternatively, these switches also can be operated by sequence signal pulses provided by a mobile unit controller.

At the top of FIG. 3 are shown the sample and compare logic circuits similar to those already discussed in FIG. 1, and wherein corresponding circuit elements are indicated by the same or similar reference characters. Thus, the flip-flop circuit 14' is here operated in the toggle mode to change state in response to each pulse which appears on lead 23. In addition, the Q output of flip-flop circuit 14' is coupled by way of a lead 40 to control logic gates, to be described, which are responsive to the output of comparator 21 so that such logic will interpret the comparator output signals properly with respect to whichever one of the sample and hold circuits 17 and 18 held the sample from the immediately preceding time interval. Two NAND gates 41 and 42 couple the outputs of flip-flop circuit 14' to the control leads 19 and 20 when those gates are enabled by a clock control signal at the binary ONE level on a lead 27' which provides the command for sampling the signal on lead 16. That is, if Q is high, gate 42 disables circuit 18; and the gate 41 enables circuit 17. The opposite state in circuit 14 enables circuit 18 while order lead 40 is high.

The output of comparator 21 is sampled at a time determined by a binary ONE level control signal on a lead 43 which enables a NAND gate 46. The output of gate 46 is applied through a further NAND gate 47 to inputs of a pair of NAND gates 48 and 49. Gate 48 is enabled by a binary ONE signal on the order lead 40, and the gate 49 is enabled by a binary ONE level signal at the output of gate 46. Outputs from gates 48 and 49 control a further NAND gate 50 which has its output applied to the lead 23 where a binary ONE pulse indicates, as shown in FIG. 1, that the newly compared sample is larger than the immediately preceding sample. In other words, when order lead 40 is high, the output of gate 50 tracks the output of comparator 21; and when lead 40 is low, the output of gate 50 is the complement of the output of comparator 21. Consequently the output of gate 50 is high only when a new sample is the larger of two compared samples.

A clock pulse control circuit 51 receives various combinations of input signals to produce controlled clock pulses for operating a four-phase clock pulse generator 52. Within the clock pulse control circuit 51 a first NAND gate 53 responds to a coincidence of binary ONE level signals from a clock pulse source 56, the absence of a clock pulse hold phase signal (to be discussed) on a lead 57, and a further signal on a lead 58 which indicates that a channel scanning sequence has been completed. Thus, gate 53 cannot couple clock pulses between sequences or when the hold phase is operative. A NAND gate 59 is similarly responsive to the clock pulses from the source 56 and the absence of the clock hold phase signal on lead 57; and it is further responsive to a start-scan signal on a lead S, which signal is selectively provided, as schematically represented by a switch 60, from a battery 61. Thus, gate 59 can couple clock pulses only at start time when the hold phase is not operative. Yet another NAND gate 62 is also provided for responding to clock pulses from source 56, clock hold phase signals appearing on lead 57 after being coupled through an inverter 63, and a frequency delay signal Fc supplied by a lead 66 from frequency synthesizer 12 to assure that the channel scanning operation cannot go forward while the frequency synthesizer 12 of FIG. 1 is stabilizing at a new frequency setting. Thus, gate 62 couples clock signals whenever the hold phase is operative and the synthesizer has stabilized. Alternatively, lead 66 could be enabled by the output of inverter 71 after a fixed delay that is chosen to be sufficient to allow synthesizer 12 to stabilize. Upon occurrence of a low output signal from any of the gates 53, 59, or 62, another NAND gate 68 is disabled and its binary ONE output is applied to the four-phase clock pulse generator 52 to step that generator from phase to phase of its four possible output phases.

Generator 52 includes a frequency divider 69 which is advantageously a two-stage binary counter activated by negative-going pulse transitions for counting the controlled clock pulses from circuit 51. The true outputs of the two stages of counter 69 are coupled by leads $A_0$ and $A_1$, along with clock pulses from the gate 68, to a code translator 70. When enabled by the binary ZERO output of gate 68, translator 70 converts the different combinations of the $A_0$ and $A_1$ inputs to a one-hot-out-of-four, bit-parallel, output code. Parallel outputs of the translator are designated 0, 1, 2, and 3 in the drawing; and each is provided with an inverted output connection as schematically represented by the small circles at the respective translator outputs. When any one of those outputs is the one hot output, a low, or binary ZERO, signal appears at the corresponding output lead. The No. 0 output is coupled through an inverter 71 to provide, when selected, a binary ONE level signal for actuating a four-bit channel counter 72. The No. 1 output of translator 70 indicates a hold phase and is applied to the lead 57 for inhibiting operation of the clock pulse control circuit 51 to allow for stabilization of the frequency synthesizer 12 in FIG. 1. The translator output No. 2 is coupled through an inverter 73 to the lead 27' for commanding a channel signal sampling operation as previously mentioned. Finally, the translator output No. 3 is coupled through an inverting circuit 76 to the lead 43 for enabling a sampling of the output of comparator 21.

Thus, once a scanning sequence has been initiated by operation of the switch 60, the four-phase clock generator 52 provides the outputs No. 0 through No. 3 in recurring sequence and increments the four-bit counter 72 on each cycle to name a new channel for sampling in the scan and lock sequence. Counter 72 is advantageously of a type that is actuated on negative-going transitions of pulses from inverter 71. Upon termination of a scan sequence, i.e., at full count, counter 72 produces a binary ONE output signal to an inverter 77 which changes the signal to a binary ZERO. Output from the inverter 77 is applied to the lead 58 for enabling NAND gate 53 only after a new scan and lock sequence has been initiated by closing switch 60 to allow a controlled clock pulse to initiate the resetting of counter 72 from its full-count state.

Output signals from the counter 72 are applied to a four-bit latch circuit 78, or register, that is enabled for loading only when a binary ONE pulse on lead 23 is coupled through an inverter 79 to provide a low enabling control signal for the latch 78. Thus, the latch stores the output of counter 72 only when a new channel sample is found to be larger than the preceding sequential sample so that a pulse is applied to lead 23.

A multiplexer 80 is controlled by two input signals $S_0$ and $S_1$ to select one of plural sets of bit-parallel input signals for application to the bus 13 which controls the frequency synthesizer 12. Only the portions of multiplexer 80 which are directly involved in operations of the present invention are here considered; and those portions include the four least significant bit outputs to bus 13. More significant bit positions in multiplexer 80 determine the location in the system band of the group of scanned channels. Multiplexer input selection in FIG. 3 is determined by a grounded input lead $S_1$ and a lead $S_0$ that is controlled by the aforementioned full-count output of counter 72 on a lead 84.

The No. 1 and No. 2 sets of inputs to the multiplexer 80 have the four least significant bits thereof provided by the four circuits of either of two buses 82 or 83, respectively, from the latch 78 or the counter 72, respectively. During a scanning sequence, the ZERO level signal provided on lead 84 from counter 72 causes multiplexer 80 to use its input set No. 1, i.e., from counter 72. At the end of a scan sequence, lead 84 goes to the ONE state; and multiplexer 80 uses its input set No. 2, i.e., from latch 78. That latch then has stored the designation of the scanned channel which provided the largest sample signal on lead 16 in FIG. 1.

Although the present invention has been described in terms of particular embodiments thereof, it is to be understood that additional modifications and applications thereof, which will be obvious to those skilled in the art, are included within the spirit and scope of the invention.

APPENDIX

SCAN AND LOCK ROUTINE

| Instruction | | | Comment |
|---|---|---|---|
| SCAN | OUT | 01B | CLEAR FLIP-FLOP 14. 01B IS THE OCTAL ADDRESS OF THIS PERIPHERAL FLIP-FLOP 14. |
| | LBI | 27B | LOAD REGISTER B (COUNTER B IN FIG. 2) WITH OCTAL 27. THIS IS THE NUMBER N OF CHANNELS TO BE SCANNED. |
| | LCI | 0B | LOAD 0 INTO REGISTER C. THIS REGISTER WILL CONTAIN THE BEST CHANNEL NUMBER. |
| | LLI | 250B | LOAD REGISTER L WITH DECIMAL 250, CORRESPONDING TO THE 8 LEAST SIGNIFICANT BITS OF THE FIRST CHANNEL TO BE SCANNED. |
| LOOP | LAL | | LOAD ACCUMULATOR A FROM REGISTER L. |
| | OUT | 10B | LOAD FREQUENCY SYNTHESIZER (ITS ADDRESS IS 10B) FROM ACCUMULATOR. |
| | CAL | DELAY | DELAY 16.436 MS. A TOTAL DELAY OF APPROXIMATELY 100 MILLISECONDS IS REQUIRED. |
| | CAL | DELAY | |
| | CAL | DELAY | |
| | CAL | DELAY | |
| | CAL | DELAY | |
| | CAL | DELAY | |
| | XRA | | CLEAR ACCUMULATOR. |
| | INP | 0B | READ PERIPHERAL X WHOSE ADDRESS IS 0B. |
| | CPI | 1B | COMPARE ACCUMULATOR WITH BINARY 1. |
| | JFZ | REPT1 | IF X IS NOT 1, GO TO REPT 1. |
| | LCL | | LOAD C WITH THE CONTENTS OF REGISTER L. |
| REPT1 | INL | | LOAD L WITH THE NEXT FREQUENCY. |
| | DCB | | DECREMENT REGISTER B. |
| | JFZ | LOOP | IF THE CONTENT OF REGISTER B IS NOT ZERO GO TO LOOP. |
| | LAC | | LOAD ACCUMULATOR WITH CONTENTS OF C. |
| | OUT | 10B | LOAD FREQUENCY SYNTHESIZER WITH THE BEST CHANNEL. |
| | RET | | RETURN TO MAIN PROGRAMS. |
| DELAY | LDI | 0B | LOAD 0 INTO REGISTER D. |
| D1 | IND | | INCREMENT D. |
| | JFZ | D1 | IF D IS NOT ZERO, GO TO D1. |
| | RET | | |

What is claimed is:

1. A mobile radio telecommunication unit having a tunable receiver and a circuit for ascertaining which one of predetermined receivable frequency channels is strongest, said circuit comprising first and second analog signal sample and hold circuits, controllable means for steering an output, which is indicative of received signal strength in one of said channels, of said receiver to one or the other of said sample and hold circuits, means for comparing outputs of said sample and hold circuits, means, responsive to an output of said comparing means, for producing a signal pulse state when a new channel sample is the larger of two compared samples and a signal no-pulse state when the new sample is the smaller of the two compared samples, and control means comprising means for sequentially tuning said receiver to each of said channels, means, responsive to said pulse state, for storing the name in said sequence of said channel having said larger sample, and means for controlling said steering means to steer each sequential channel sample from said receiving means to the one of said sample and hold circuits that held said smaller sample of two previously compared samples.

2. The mobile radio telecommunication unit in accordance with claim 1 in which said steering means comprises a bistable trigger circuit having true and complement outputs, means for coupling each of said trigger circuit outputs to enable a different one of said sample and hold circuits to receive a new channel sample in response to one signal level state from its trigger circuit output, and means, responsive to said controlling means, for actuating said trigger circuit to a new one of its stable states.

3. The telecommunication unit in accordance with claim 1 in which said tuning means comprises means for receiving a train of clock pulses, means for counting pulses, each pulse count corresponding to a different one of said channels, means, responsive to said clock pulses for generating a recurrent sequence of clock phase signals for sequentially stepping said counting means, inhibiting for a predetermined time the stepping of said counting means, and enabling said storing means, means, responsive to contents of said counting means, for tuning said receiver to one of said channels corresponding to said counter contents, and means, responsive to a predetermined count level in said counting means, for tuning said receiver to one of said channels corresponding to said storing means contents.

4. The mobile radio telecommunication unit in accordance with claim 1 in which said producing means comprises means for performing an EXCLUSIVE OR logic function with respect to an output of said comparing means and an output of said controlling means to a predetermined one of said sample and hold circuits.

5. The telecommunication unit in accordance with claim 4 in which said controlling means includes means for providing an order signal indicating by one signal state that a predetermined one of said sample and hold circuits is enabled, and said performing means comprises first and second coincidence gates connected to be enabled, respectively, by said order signal state and a predetermined output state of said comparing means, means for disabling said gates in response to a coincidence of said order signal state and said predetermined comparing means output state, and means, responsive to outputs of both of said gates, for providing said producing means pulse state in response to actuation of at least one of said gates.

* * * * *